United States Patent
Kojima et al.

(10) Patent No.: US 7,323,220 B2
(45) Date of Patent: Jan. 29, 2008

(54) GAS PHASE GROWTH SYSTEM, METHOD OF OPERATING THE SYSTEM, AND VAPORIZER FOR THE SYSTEM

(75) Inventors: Yasuhiko Kojima, Nirasaki (JP); Vincent Vezin, Nirasaki (JP); Tomohisa Hoshino, Nirasaki (JP)

(73) Assignee: Tokyo Electron Ltd., Minato-ku, Tokyo-To (JP)

( * ) Notice: Subject to any disclaimer, the term of this patent is extended or adjusted under 35 U.S.C. 154(b) by 0 days.

(21) Appl. No.: 10/998,738

(22) Filed: Nov. 30, 2004

(65) Prior Publication Data
US 2005/0092250 A1    May 5, 2005

Related U.S. Application Data

(62) Division of application No. 09/918,645, filed on Aug. 1, 2001, now abandoned.

(30) Foreign Application Priority Data
Aug. 1, 2000    (JP) .............................. 2000-233238

(51) Int. Cl.
*C23C 16/18*    (2006.01)
(52) U.S. Cl. ....................... 427/250; 427/252
(58) Field of Classification Search ................ 427/250, 427/252
See application file for complete search history.

(56) References Cited

U.S. PATENT DOCUMENTS

| | | | | |
|---|---|---|---|---|
| 6,037,001 A | * | 3/2000 | Kaloyeros et al. | 427/250 |
| 6,077,571 A | * | 6/2000 | Kaloyeros et al. | 427/576 |
| 6,245,261 B1 | * | 6/2001 | Zhuang et al. | 252/519.2 |
| 6,281,377 B1 | * | 8/2001 | Zhuang et al. | 556/112 |
| 6,576,293 B2 | * | 6/2003 | Zhuang et al. | 427/252 |
| 6,596,344 B2 | * | 7/2003 | Zhuang et al. | 427/250 |
| 6,726,954 B2 | * | 4/2004 | Zhang et al. | 427/252 |
| 6,764,537 B2 | * | 7/2004 | Zhuang et al. | 106/1.26 |

* cited by examiner

*Primary Examiner*—Bret Chen
(74) *Attorney, Agent, or Firm*—Finnegan, Henderson, Farabow, Garrett & Dunner L.L.P.

(57) ABSTRACT

A method of operating a gas phase growth system is disclosed. The method includes a processing stage and a stabilizer feeding stage. In a non-limiting embodiment of the disclosure, an organometallic complex is vaporized by a vaporizer, and subsequently fed to a reaction chamber through a gas line communicating the vaporizer with the reaction chamber, whereby a film is formed on a substrate in the reaction chamber. During the stabilizer feeding stage, a stabilizer for the organometallic complex is fed in a gaseous state during normal operation of the vaporizer, wherein the stabilizer feeding stage is executed when the vaporizer is not vaporizing the organometallic complex.

5 Claims, 5 Drawing Sheets

| | PRE-PURGING STAGE | PROCESSING STAGE | POST-PURGING STAGE | END STAGE |
|---|---|---|---|---|
| $V_1 (V_1')$ | × | ○ | × | × |
| $V_2 (V_2')$ | ○ | ○ | ○ | × |
| $V_3 (V_3')$ | ○→× | × | ○ | × |
| $V_4$ | ○ | ○ | ○ | × |
| $V_5$ | ○ | × | × | ○ |
| $V_6$ | ○ | ○ | ○ | ○ |
| PUMP | ON | ON | ON | ON |

( ○ : OPEN  × : CLOSE )

FIG. 3

GAS PHASE GROWTH SYSTEM, METHOD OF OPERATING THE SYSTEM, AND VAPORIZER FOR THE SYSTEM

RELATED APPLICATION

This is a division of application Ser. No. 09/918,645, filed Aug. 1, 2001, now abandoned which is incorporated herein by reference.

BACKGROUND OF THE INVENTION

1. Field of the Invention

The present invention relates to a gas phase growth system, such as a CVD system, in which an organometallic complex vaporized by means of a vaporizer is fed into a reaction chamber to form a film on a substrate in the reaction chamber, and also relates to a method of operating the system, and a vaporizer included in the system. More particularly, the present invention relates to a technique for preventing undesirable deposition of products, which are formed from the organometallic complex, onto a surface of parts of the system, such as the vaporizer and lines connected thereto.

2. Description of the Related Art

In a ULSI, particularly a logic circuit, aluminum (Al) has been used as a wiring material. However, problems of increasing in wire delay-time and wiring fault caused by high electric resistance and poor electromigration resistance of Al often arise, due to the recently high degree of integration of the circuit. Thus, copper (Cu), having a low electric resistance and an excellent electromigration resistance, has been recently used as the wiring material.

Copper wiring is carried out by a process called damascine in which an inter-layer insulating film is etched to form grooves and holes according to a predetermined wiring pattern, copper is deposited in the grooves and holes, and then unnecessary parts of the copper is ground away. At present, a copper film is deposited mainly by the PVD method to form a seed film, and by the electroplating method to form wiring.

However, due to the recent refinement of devices, the aforementioned methods are no longer sufficient for keeping up with current standards involving the seed film formation and the wiring. As a result, a CVD (chemical vapor deposition) method, which enables a satisfactory coverage, has recently been the focus of attention as a next generation seed film forming and wiring art.

When forming a copper film by the CVD method, it is necessary to feed gas including copper into the reaction chamber. However, in general an inorganic compound of copper has a low vapor pressure, so very high temperature and high vacuum are required in order to convert it to a gas state. Under these circumstances, recently, in the film forming process, an organometallic complex of copper, such as hexafluoroacetylacetonate trimethyl vinylsilane copper (hereinafter, referred to as Cu (hfac) TMVS), which has a high vapor pressure, has been used as a raw material. The organometallic complex is a molecule (an ion) containing an organic matter and a metal, and formed by coordinate bonding of organic molecules (ions) to metallic atoms.

The organometallic complex is generally in a liquid state or a solid state under normal temperature and pressure. Therefore, in the film forming process, an organometallic complex is vaporized by a vaporizer, and then fed into the reaction chamber.

However, the organometallic complex is generally unstable. This is because bond energy of the coordinate bond between metallic atoms and organic molecules is smaller than bond energy between molecules, in general. Therefore, under a certain unbalanced condition, the organometallic complex gradually decomposes. While the vaporized organometallic complex is traveling to the reaction chamber, products formed from organometallic complex are inevitably deposited on inner walls of the vaporizing chamber of the vaporizer and inner surfaces of pipes connecting the vaporizer to the reaction chamber. Accretion of such deposits causes reduction in the cross-sectional area of the pipes and results in clogging, thus periodical removal of these deposites is necessary.

Japanese Patent Laid-Open Publication Hei10-88349 discloses a method of removing such deposits. In this method, a cleaning liquid of trimethyl vinylsilane (TMVS) is fed into a pipe, which connects a reservoir of organometallic complex (liquid) and a vaporizer. The cleaning liquid is fed into the vaporizer, a pipe connecting the vaporizer and a reaction chamber, and the reaction chamber, in that order, thus removing deposits in each area.

Japanese Patent Laid-Open Publication Hei08-176826 discloses a CVD system. In this system, a solvent in a liquid state acting as a cleaning liquid is always fed into a vaporizer together with inert gas. When the film forming process is carried out, an organometallic complex in a liquid state is fed into the vaporizer together with the solvent.

However, when the solvent is fed into the pipe for the organometallic complex as in the case of the former (Japanese Patent Laid-Open Publication Hei10-88349), a considerable amount of time is required to remove the cleaning liquid, resulting in reduction in the operation efficiency of the system. Even if a lot of time is spent on removal, it is difficult to remove the cleaning liquid completely, and some cleaning liquid may remain in the system. If this is the case, concentration of the raw material fed into the vaporizer is inconsistent, and thus a problem arises in that the replication of the process is adversely affected. Further, since the vaporizer is cleaned with a liquid, the temperature of the vaporizer lowers and a considerable time is required to return the vaporizer to its original temperature. During this period of time, the next process cannot be performed, thus resulting in a reduction in the operation efficiency of the system. In addition, the temperature of the vaporizer becomes unstable, thus the replication of the process is adversely affected. Also, when a liquid is used for cleaning, a large amount of cleaning liquid is required, which it is not economically desirable.

Also, in the case of the latter (Japanese Patent Laid-Open Publication Hei8-176826), the concentration of the raw material to be sent to the vaporizer inevitably becomes inconsistent.

SUMMARY OF THE INVENTION

Therefore the object of the present invention is to avoid undesirable deposition, which are formed from the organometallic complex, onto a surface of parts of the system, such as the vaporizer and lines connected thereto.

The second object of the present invention is to achieve the first objective effectively and economically without affecting on the replication of the process.

To accomplish the above objectives, the present invention provides a method of operating a gas phase growth system, which includes: a processing stage, in which an organometallic complex is vaporized by a vaporizer, and the vaporized organometallic complex is fed to a reaction chamber through a gas line communicating the vaporizer with the reaction chamber, whereby a film is formed on a substrate in the reaction chamber; and a stabilizer feeding stage, in which a stabilizer for the organometallic complex is fed in a gaseous state into a gas area of the vaporizer or into the gas line, where the gas area is an area in which the organometallic complex has been vaporized and exists in a gaseous state during normal operation of the vaporizer, wherein the stabilizer feeding stage is executed when the vaporizer is not vaporizing the organometallic complex.

The stabilizer may be an agent, which is equivalent to a ligand capable of being coordinate-bonded with metallic atoms included in an organometallic complex, and reducing reaction rate of the decomposition reaction of the organometallic complex.

When a stabilizer is fed into a system where an organometallic complex exists, reaction rate of decomposition reaction of organometallic complex becomes less than that of synthesis reaction (i.e., the reverse reaction of the decomposition reaction), and thus an apparent reaction rate of decomposition reaction is suppressed. Thus, deposition of products formed from the organometallic complex is suppressed.

The stabilizer may be fed in the prepurging stage to be executed before the processing stage of film forming in the reaction chamber or in the postpurging stage to be executed after the processing stage.

The present invention also provides a gas phase growth system, which includes: a reaction chamber in which a substrate is processed; a vaporizer that vaporizes an organometallic complex; a gas line communicating the vaporizer with the reaction chamber to feed the vaporized organometallic complex into the reaction chamber; and a stabilizer feeder that feeds a stabilizer for the organometallic complex in a gaseous state into a gas area of the vaporizer or into the gas line, where the gas area is an area in which organometallic complex has been vaporized and exists in a gaseous state during normal operation of the vaporizer.

The present invention also provides a vaporizer for vaporizing an organometallic complex to be fed into a reaction chamber of a gas phase growth system, said vaporizer including: a body with a vaporizing chamber; a first path through which the organometallic complex is fed into the vaporizing chamber; and a second path through which a stabilizer for said organometallic complex is fed to a gas area of the body in a gaseous state, where the gas area is an area in which organometallic complex has been vaporized and exists in a gaseous state during normal operation of the vaporizer.

BRIEF DESCRIPTION OF THE DRAWINGS

FIG. 3 is a table showing an operation sequence of each valve of the gas phase growth system;

DESCRIPTION OF THE PREFERRED EMBODIMENTS

The embodiments of the present invention will be explained with reference to the accompanying drawings.

Figure 1:
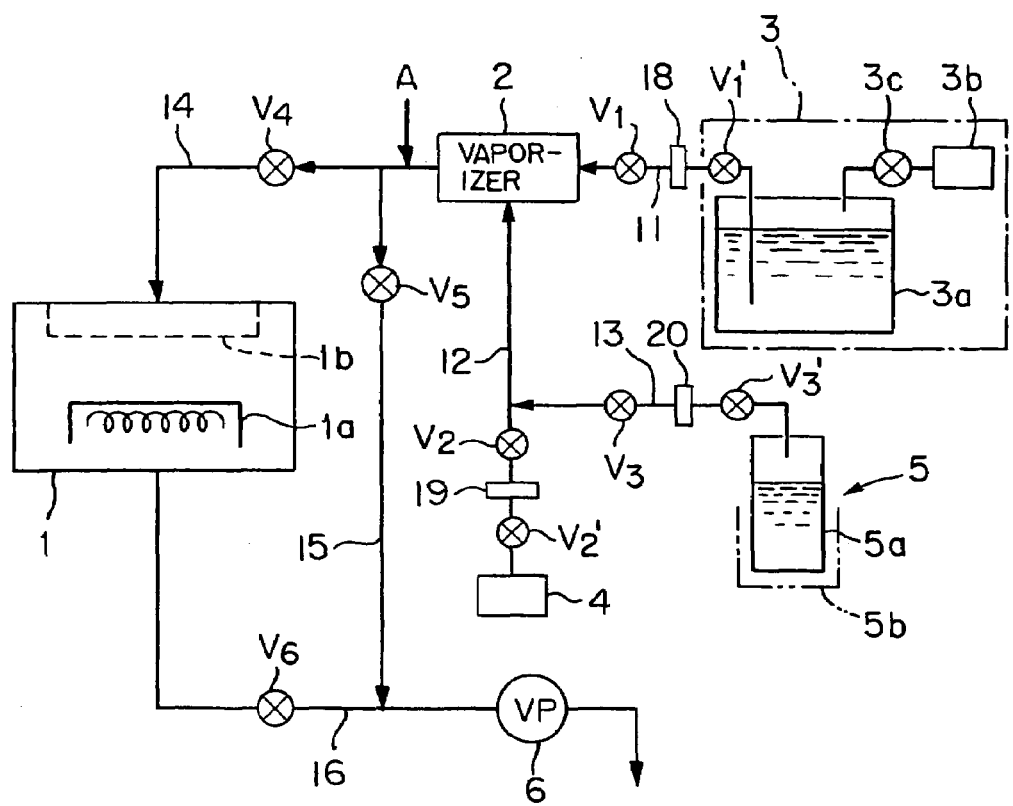
FIG. 1 is a diagram schematically showing the whole construction of an embodiment of a gas phase growth system according to the present invention.

With reference to FIG. 1, the whole construction of a gas phase growth system will be described. The gas phase growth system has a reaction vessel defining a reaction chamber 1 and a vaporizer 2. A loading stage 1a with a heating element embedded therein is installed at a lower part in the reaction chamber 1. A shower head 1b is installed at an upper part in the reaction chamber 1.

The gas phase growth system also has a liquid raw material feed source 3, which includes a raw material reservoir 3a, a carrier gas (He gas) feed source 3b and a valve 3c. The reservoir 3a reserves a raw material, i.e., an organometallic complex, such as Cu (hfac) TMVS in a liquid state.

The liquid raw material feed source 3 is connected to the vaporizer 2 via a line 11. A valve V1', a mass flow controller 18 and a valve V1 is provided on the line 11, in that order, from a raw material reservoir 3a toward the vaporizer 2. When the valve 3c opens, the carrier gas is fed from the carrier gas feed source 3b into the reservoir 3a, the reservoir 3a is internally pressurized by a carrier gas, and thus the raw material is send out toward the line 11. When the valve 3c closes, the carrier gas is not fed into the reservoir 3a.

A carrier gas (He gas) feed source 4 is connected to the vaporizer 2 via a line 12. A valve V2', a mass flow controller 19 and a valve V2 is provided on the line 12, in that order, from the carrier gas feed source 4 toward the vaporizer 2.

At a point downstream of the valve V2, a stabilizer feed source 5 is connected to the line 12 via a line 13. The stabilizer feed source 5 is comprises a stabilizer reservoir 5a that reserves a stabilizer for an organometallic complex in a liquid state. TMVS is used as the stabilizer when the organometallic complex is Cu (hfac) TMVS. A valve V3', a mass flow controller 20 and a valve V3 are provided on the line 13, in that order, from the stabilizer feed source 5 toward the line 12. Depending on the kind of stabilizer to be used, in other words, if difficulty in vaporizing the stabilizer exists, a heater 5a may be provided at the stabilizer feed source 5 in order to promote vaporization of the stabilizer.

An outlet of the vaporizer 2 and an inlet of the shower head 1b of the reaction chamber 1 are connected via a line (pipe) 14. A valve V4 is provided on the line 14. A reaction chamber 1 is connected to a vacuum pump 6, such as a turbo molecular pump, via a line 16. Upon operation of the vacuum pump 6, the reaction chamber 1 and an interior space upstream of the vacuum pump 6 are decompressed. A valve V6 is provided on the line 16.

A point upstream of the valve V4 on the line 14 and a point upstream of the vacuum pump 6 and downstream of the valve V6 on the line 16 are connected via a line 15. A valve V5 is provided on the line 15.

The construction of the vaporizer 2 will be described with reference to FIG. 2. The vaporizer 2 has a liquid reservoir chamber 2a, to which the line 11 is connected. Provided downstream of the liquid reservoir 2a is a vaporizing chamber 2b. The cross-sectional area of the vaporizing chamber 2b increases as go downstream. The liquid reservoir chamber 2a communicate with the vaporizing chamber 2b via a narrow hole 2c.

On a side opposite to the narrow hole 2c, the liquid reservoir chamber 2a is provided with a diaphragm 2e operated by a liner actuator 2d. The diaphragm 2e can take a position in which the narrow hole 2c is closed (the dashed line shown in FIG. 2), and a position in which the narrow hole 2c communicates the reservoir chamber 2a and the vaporizing chamber 2b (the solid line shown in FIG. 2) with each other through the operation of the linear actuator 2d. A heater 2f is embedded in a body of the vaporizer 2.

During normal operation of the vaporizer 2, an area where the raw material (organometallic complex) has been vaporized and exists in a gaseous state is referred to as a "gas area" (the area indicated by Av in FIG. 2) and an area upstream of the "gas area", that is, the area where the raw material exists in a liquid state is referred to as a "liquid area".

A line 12 is connected to the vaporizing chamber 2b, thus the carrier gas and a stabilizer flowing through the line 12 are fed into the gas area Av of the vaporizer 2.

Next, operations of the gas phase growth system will be described with reference to FIG. 3. The gas phase growing system is operated by repeating a cycle of the following four stages (pre-purging stage, processing stage, post-purging stage, and end stage).

(1) Pre-purging Stage (Process Standby Stage)

Firstly, the valves V1 and V1' are closed, and the valves V2 and V2' are opened, and the valves V3 and V3' are opened, and the valve V4 is opened, and the valve V5 is opened, and the valve V6 is opened, and then the pre-purging stage is executed.

In this case, the stabilizer reservoir of the stabilizer feed source 5 is internally decompressed by the vacuum pump 6, thus the stabilizer in the stabilizer reservoir 5a is vaporized. The vaporized stabilizer flows into the line 13 by the suction force of the vacuum pump 6 and flows into the line 12. Then, the stabilizer in a gaseous state flows into the vaporizing chamber 2b of the vaporizer 2, particularly into the gas area Av, together with carrier gas flowing through the line 12. At this time, the diaphragm 2e is in the position for closing the narrow hole 2c (the dashed line position shown in FIG. 2), and thus the raw material (organometallic complex) is prevented from flowing into the vaporizing chamber 2b.

If an organometallic complex fed in the processing stage of the previous cycle is deposited or left on the wall of the vaporizing chamber 2b, the stabilizer contacts with the organometallic complex so that the stabilizer avoids deposition of products formed from the organometallic complex, which is a precursor of the products.

Upon adding the stabilizer TMVS to the system, synthesis reaction from the right side to the left side of the following reversible reaction formula:

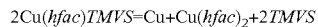

2Cu(hfac)TMVS=Cu+Cu(hfac)$_2$+2TMVS is promoted, and the decomposition of the organometallic complex is suppressed.

The stabilizer and carrier gas are removed from the system via the line 14, the reaction chamber 1 and the line 16. The stabilizer and carrier gas are also removed via the line 15. The stabilizer contacts with inner walls of the lines 14, 15, and 16 and the inner member of the reaction chamber 1, and thus the stabilizer also avoids formation of products on these members.

After the stabilizer has been fed for a predetermined period, the valve V3 is changed to a closed state in order to stop feeding the stabilizer into the system, on the contrary, supply of the carrier gas (He gas) and operation of the vacuum pump 6 is continued. Thereby, the stabilizer existing in the system is removed outside, thus the pre-purging stage is completed.

(2) Processing Stage

After the pre-purging stage has been completed, the valves V1 and V1' are changed from the closed state to the open state, and the valves V2 and V2' are kept in the open state, and the valves V3 and V3' are put into the closed state, and the valve V4 is kept in the open state, and the valve V5 is changed from the open state to the closed state, and the valve V6 is kept in the open state, and then the film forming process is executed. In this case, carrier gas is fed from the carrier gas feed source 4 to the vaporizer 2, a raw material (organometallic complex) in a liquid state is fed from the liquid raw material feed source 3 to the vaporizer 2, and no stabilizer is fed to the vaporizer 2.

Figure 2:
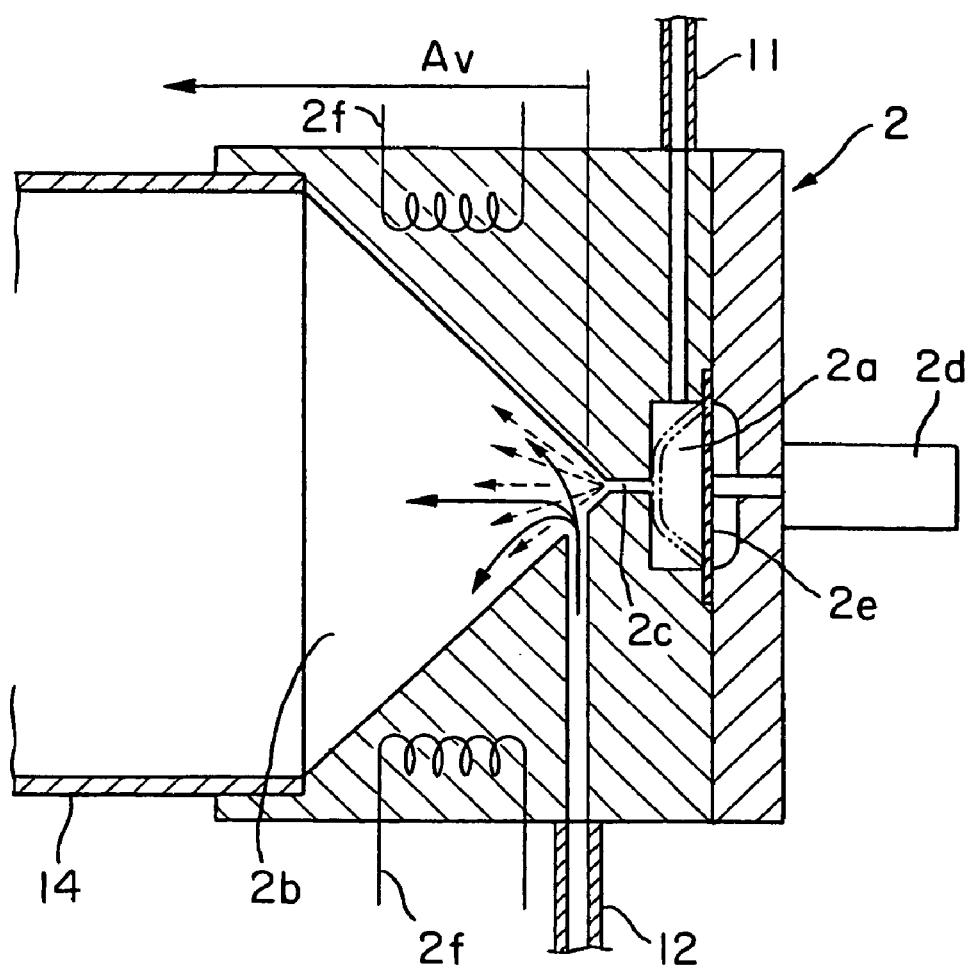
FIG. 2 is a cross-sectional view schematically showing the internal construction of a vaporizer.

In the processing stage, the diaphragm 2e is set in the solid line position shown in FIG. 2. As a result, the organometallic complex is sprayed into the decompressed vaporizing chamber 2b via the narrow hole 2c, and is vaporized immediately. The vaporized organometallic complex is fed to the reaction chamber 1 via the line 14 together with carrier gas (for example, He gas) flowing into the vaporizing chamber 2b via the line 12. In the decompressed reaction chamber 1, a substrate (not shown), such as a semiconductor wafer, loaded on the loading stage 1a is heated, and the vaporized organometallic complex forms a film on the substrate by a specific thermochemical reaction.

(3) Post-purging Stage

After the processing stage has been completed, the valves V1 and V1' are changed from the open state to the closed state, and the valves V2 and V2' are kept in the open state, and the valves V3 and V3' are changed from the closed state to the open stage, and the valve V4 is kept in the open state, and the valve V5 is kept in the closed state, and the valve V6 is kept in the open state, and then the postpurge is executed. In this case, in the same way as with the prepurging stage, a vaporized stabilizer flows into the line 13 from the stabilizer feed source 5, and flows into the line 12. The stabilizer in a gaseous state flows into the gas area Av of the vaporizing chamber 2b of the vaporizer 2 together with carrier gas flowing through the line 12. At this time, the diaphragm 2e is in the position for blocking the narrow hole 2c (the dashed line position shown in FIG. 2), and thus the organometallic complex is prevented from flowing into the vaporizing chamber 2b.

The stabilizer contacts with an organometallic complex left on the wall of the vaporizing chamber 2b and a products (deposit) if any, produced from the organometallic complex, formed on the wall of the vaporizing chamber 2b in the previous processing stage, thus the stabilizer avoids deposition of the products formed from the organometallic complex, and removes the products, if any.

The stabilizer and carrier gas are removed from the system via the line 14, the reaction chamber 1 and the line 16. When passing the line 14, the reaction chamber 1 and the line 16, the stabilizer contacts with the inner walls of the lines 14 and 16 and the inner wall and the inner member of the reaction chamber 1. The stabilizer also avoids formation of the products on these members, and removes the products.

(4) End Stage (Initial Stage)

When the postpurging stage is finished, the valves V1 and V1' are kept in the closed state, and the valves V2 and V2' are changed from the open state to the closed state, and the valves V3 and V3' are changed from the open state to the closed stage, and the valve V4 is changed from the open state to the closed stage, and the valve V5 is changed from the closed state to the open stage, and the valve V6 is kept in the open state.

In this state, interiors of the reaction chamber 1, the vaporizer 2 and the lines 14, 15, and 16 are kept in a decompressed state. Further, the downstream side of the valve V1 in the line 11, the downstream side of the valve V2 in the line 12 and the downstream side of the valve V13 in the line 13 are kept in a decompressed state. At this time, the diaphragm 2e is in the position for blocking the narrow hole 2c (the dashed line position shown in FIG. 2) and the raw material is prevented from flowing in the vaporizing chamber 2b.

When the valves V1 and V1' are kept in the closed state, and the valves V2 and V2' are changed from the closed state to the open state, and the valves V3 and V3' are changed from the closed state to the open stage, and the valve V4 is changed from the closed state to the open stage, and the valve V5 is kept in the open stage, and the valve V6 is kept in the open state, the operation can be returned to the pre-purging stage again from the end stage.

In this embodiment, when vaporization is not carried out by the vaporizer 2, that is, before or after the processing stage (for example, in the pre-purging stage or the post-purging stage), a stabilizer is fed into the gas area of the vaporizer 2 in a gaseous state. Thus, products formed from the organometallic complex, which is a precursor of the product, is not deposited in the vaporizer 2 or in the line downstream of the vaporizer 2.

Therefore, it is not necessary to carry out maintenance of the gas phase growing system frequently. Since a stabilizer acting as a detergent is fed in a gaseous state, the stabilizer can be completely removed from the system only by sucking the system by the vacuum pump 6 for a relatively short period. As compared with a case of use of a liquid, temperature drop of the vaporizer is less, and thus replication of the process is not adversely affected.

According to the aforementioned embodiment, the stabilizer is fed into the gas area Av of the vaporizer 2. However, the stabilizer may be fed to a point downstream of the gas area Av of the vaporizer 2, for example, a suitable point of the line 14 between the vaporizer 2 and the reaction chamber 1 (for example, the point indicated by the arrow A in FIG. 2).

When a vaporizer of the type shown in FIG. 2 is to be used, a stabilizer is fed from the carrier gas line (the line 12) of the vaporizer 2. However, when another type of vaporizer is used, a stabilizer may be fed into the vaporizer from another line.

Figure 4:
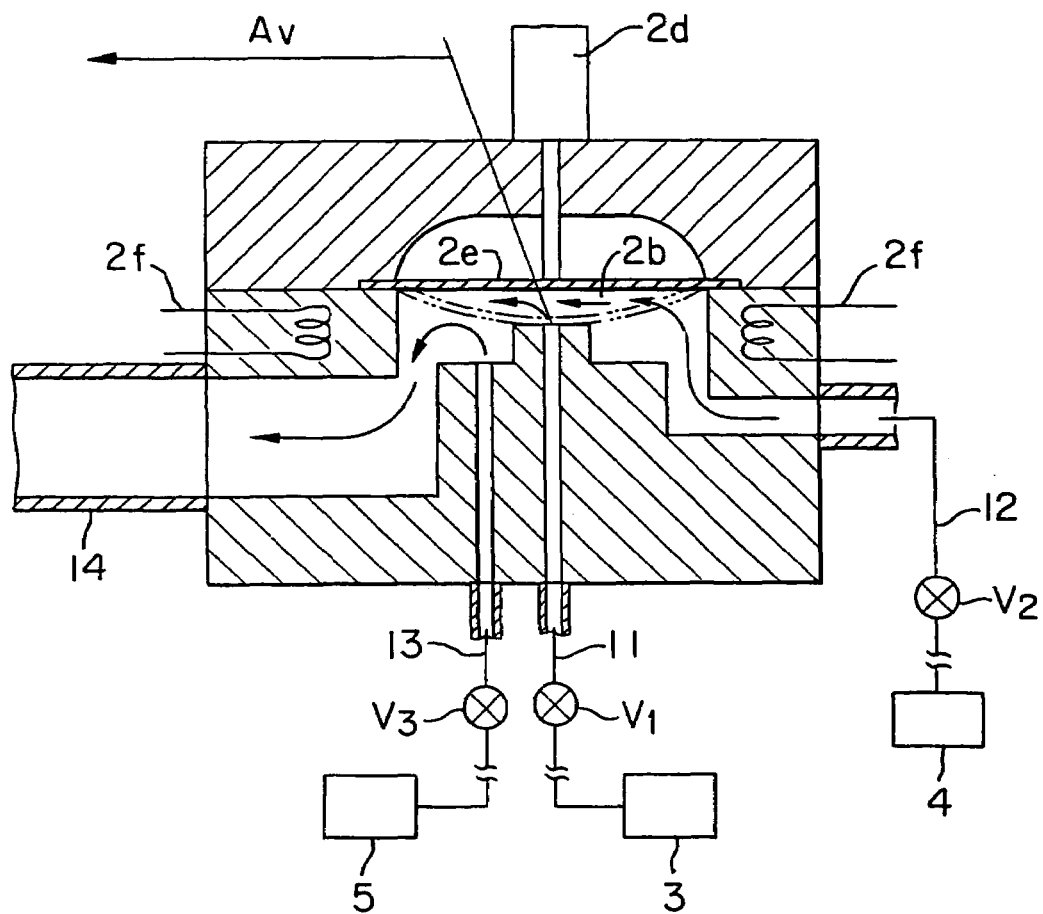
FIG. 4 is a cross-sectional view schematically showing the internal construction of another type of vaporizer.

In a vaporizer having the construction shown in FIG. 4 (in FIG. 4, to the same or similar members as those shown in FIG. 2, the same numerals as those shown in FIG. 2 are assigned), unlike a vaporizer having the construction shown in FIG. 2, a stabilizer is not introduced into the vaporizing chamber 2b from the carrier gas line together with carrier gas. Instead, a stabilizer in a gaseous state is introduced into the vaporizing chamber 2b from a position downstream of the point at which an organometallic complex is introduced into the vaporizing chamber 2b.

Figure 5:
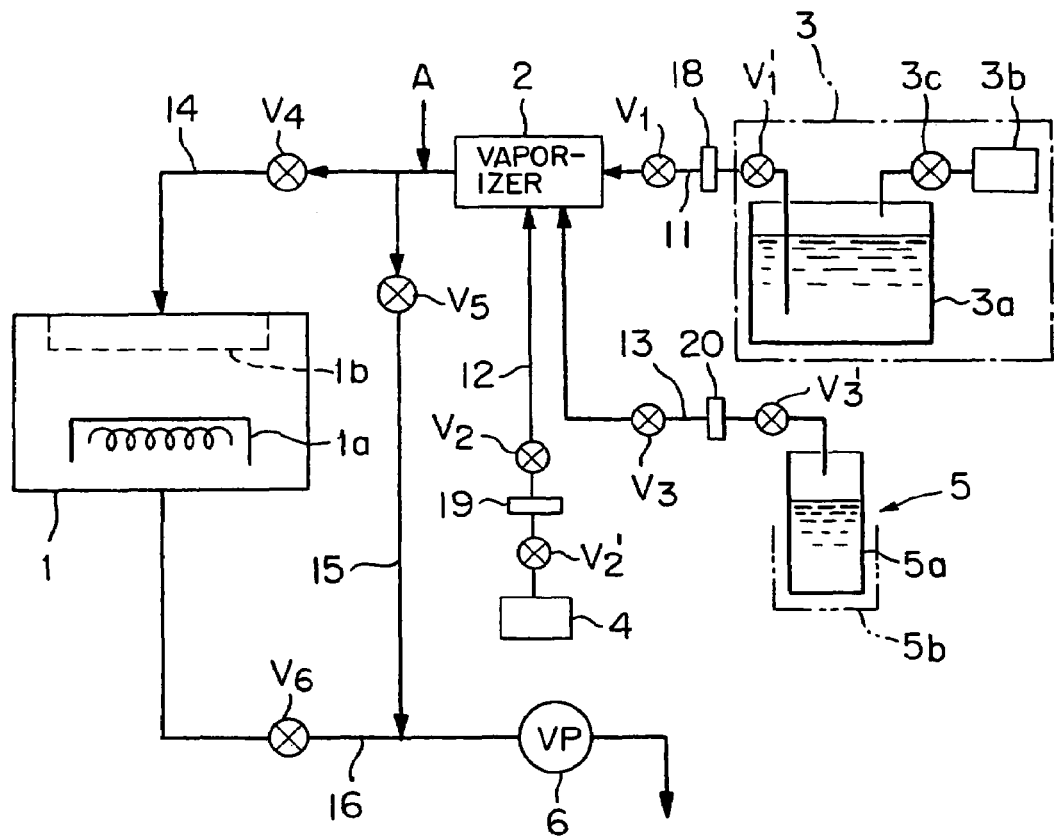
FIG. 5 is a diagram schematically showing the whole construction of a gas phase growth system when a vaporizer of the type shown in FIG. 4 is used.

In the vaporizer shown in FIG. 4, carrier gas is introduced to a point on the most upstream portion of the vaporizing chamber 2b from the carrier gas line (line), and the raw material of organometallic complex is fed into the vaporizing chamber 2b at a point downstream of the point on the most upstream portion vaporizing chamber 2b. In this case, an area downstream of the point where the line 11 is opened to the vaporizing chamber 2a is the gas area Av of the vaporizer 2. Thus, the stabilizer may be fed into the vaporizing chamber 2a at a point downstream of the point where the line 11 is opened to the vaporizing chamber 2a. In this case, the piping arrangement of the gas phase growth system, as shown in FIG. 5, may be designed in the same way as that shown in FIG. 1, except that the line 13 is not joined to the line 12.

In the aforementioned embodiments, the raw material (i.e., organometallic complex) is Cu (hfac) TMVS, and the stabilizer is TMVS. Instead, the combination of the raw material and the stabilizer may be as follows:

Cu (hfac) TMOVS and TMOVS;
Cu (hfac) ATMS and ATMS; or
Cu (hfac) MHY and MHY.

Namely, a substance, which is equivalent to a ligand of the organometallic complex and is capable of suppressing decomposition of the organometallic complex, may be used as a stabilizer.

What is claimed is:

1. A method of operating a gas phase growth system, the system having a reaction chamber, a vaporizer adapted to vaporize an organometallic complex, and a gas line connecting the vaporizer to the reaction chamber, said method comprising the steps of:
   a) evacuating the reaction chamber and the vaporizer
   b) supplying a stabilizer in a gaseous state into the vaporizer, thereby establishing an atmosphere of the stabilizer in the vaporizer, the gas line, and the reaction chamber, said stabilizer being capable of stabilizing the organometallic complex;
   c) stopping supplying the stabilizer into the vaporizer;
   d) discharging the stabilizer from the vaporizer, the gas line and the reaction chamber;
   e) loading a substrate into the reaction chamber, and heating the substrate in the reaction chamber;
   f) supplying an organometallic complex into the vaporizer, spraying the organometallic complex into a vaporizing chamber of the vaporizer, and vaporizing the organometallic complex in the vaporization chamber so as to obtain a vaporized organometallic complex;
   g) supplying the vaporized organometallic complex into the reaction chamber through the gas line, without supplying the stabilizer into the reaction chamber;
   h) forming a metallic layer on the heated substrate by the vaporized organometallic complex;
   i) stopping supplying the organometallic complex into the vaporizer;
   j) supplying the stabilizer in a gaseous state into the vaporizer, thereby establishing an atmosphere of the stabilizer in the vaporizer, the gas line, and the reaction chamber; and
   k) discharging the stabilizer from the vaporizer, the gas line, and the reaction chamber.

2. The method according to claim 1, wherein in steps b) and j), the stabilizer is supplied into the vaporizer together with a carrier gas.

3. The method according to claim 1, wherein the vaporizer has a spraying hole for spraying the organometallic complex into the vaporizing chamber, and wherein, in steps b) and j), the stabilizer is supplied into the vaporizing chamber from a hole that opens into the vaporizing chamber at a position downstream of and adjacent to the spraying hold for spraying the organometallic complex.

4. The method according to claim 1, wherein the organometallic complex is CU(hfac)TMVS, and the stabilizer is TMVS.

5. The method according to claim 1, wherein the organometallic complex is CU(hfac)(MHY), and the stabilizer is MHY.

* * * * *